United States Patent [19]

Guthrie et al.

[11] Patent Number: 5,748,047
[45] Date of Patent: May 5, 1998

[54] MICROWAVE FREQUENCY GENERATOR AND METHOD OF GENERATING A DESIRED MICROWAVE FREQUENCY SIGNAL

[75] Inventors: Warren E. Guthrie, Wheaton; Gary S. Garbe, Schaumburg, both of Ill.

[73] Assignee: Northrop Grumman Corporation, Los Angeles, Calif.

[21] Appl. No.: 689,874

[22] Filed: Aug. 15, 1996

[51] Int. Cl.$^6$ ............... H03L 1/02; H03L 7/00; H03L 7/16; H04B 1/26
[52] U.S. Cl. ............... 331/19; 331/16; 331/41; 331/39; 331/44; 331/176; 455/260; 455/314; 455/318
[58] Field of Search ............... 331/2, 16, 18, 331/19, 22, 31, 37–44, 176; 455/313, 314, 318, 260

[56] References Cited

U.S. PATENT DOCUMENTS

| | | | |
|---|---|---|---|
| 3,277,379 | 10/1966 | Hacks et al. | 455/318 X |
| 3,942,118 | 3/1976 | Shiki | 455/314 |
| 4,105,946 | 8/1978 | Ikeda | 331/1 A |
| 4,146,850 | 3/1979 | Fache et al. | 331/117 R |
| 4,272,729 | 6/1981 | Riley, Jr. | 331/1 A |
| 4,328,554 | 5/1982 | Mantione | 364/721 |
| 4,379,271 | 4/1983 | Lehmann | 331/49 |
| 4,516,170 | 5/1985 | Skerlos | 358/191.1 |
| 4,527,280 | 7/1985 | Ijichi et al. | 455/183 |
| 4,839,603 | 6/1989 | Mower | 328/14 |
| 4,891,610 | 1/1990 | Veith | 331/96 |
| 5,028,887 | 7/1991 | Gilmore | 331/18 |
| 5,291,428 | 3/1994 | Twitchell et al. | 364/602 |
| 5,353,311 | 10/1994 | Hirata et al. | 375/1 |
| 5,390,346 | 2/1995 | Marz | 455/260 |

*Primary Examiner*—David Mis
*Attorney, Agent, or Firm*—Terry J. Anderson; Karl J. Hoch, Jr.

[57] ABSTRACT

A microwave frequency generator and method of generating a predetermined microwave signal. The invention comprises oscillator means to generate a determinable frequency signal and means responsive to the frequency signal received from the oscillator means to generate a predetermined Intermediate Frequency (IF) signal. The invention further includes means to generate a determinable ultrahigh frequency (UHF) signal, along with means responsive to the IF signal and to a UHF signal to generate a resultant frequency signal. Means responsive to the resultant frequency and to the predetermined frequency signal generated by the oscillator means are further provided to generate the desired predetermined microwave frequency signal.

24 Claims, 3 Drawing Sheets

FIG. 3

MICROWAVE FREQUENCY GENERATOR AND METHOD OF GENERATING A DESIRED MICROWAVE FREQUENCY SIGNAL

BACKGROUND OF THE INVENTION

1. Field of the Invention

The present invention relates generally to an improvement in frequency synthesizers and more particularly, but not by way of limitation, to an arrangement and method for quickly synthesizing frequencies in the microwave region which affords high performance with respect to tuning speed and minimization of phase noise and spurious frequency signals as well as permitting physical embodiment in a very small size.

2. Description of the Prior Art

Frequency synthesizers using phase locked loops with voltage controlled oscillators are well known. A phase locked loop basically comprises a feedback circuit for producing a fine tune control signal which is applied to the voltage controlled oscillator and operates to bring the output signal of the oscillator into phase lock with a reference signal. When the tuning range of the voltage controlled oscillator is greater than the capture range of the phase locked loop, it is a frequent requirement that the voltage controlled oscillator be coarse or pre-tuned to bring the frequency of its output signal within the capture range of the phase locked loop so that the system will be able to acquire phase lock. While various methods for pretuning the voltage controlled oscillator have been employed, difficulties have arisen in the use of such methods because misalignment of the oscillator, aging of components, oscillator drift and temperature effects can often result in the need to coarse tune the oscillator with a voltage signal which is different from the predetermined signal for a given output frequency. A predetermined fixed tuning voltage cannot adapt to the changing conditions brought about by these factors and requires frequent adjustment. Also, the characteristics of frequency synthesizers and voltage controlled oscillators vary from one synthesizer to the other thereby requiring that the predetermined tuning voltages be established individually for each synthesizer during production, thereby increasing the cost of production. Phase locked loops have also been found unsuitable for many wide-range synthesizer applications because of the inherent tradeoffs between tuning step size, phase noise levels, spurious signal levels, and acquisition time.

While previous specific patents of the prior art are of general interest, none are believed to disclose the novel features and overall arrangement and method of the present invention. Such prior art includes U.S. Pat. No. 5,390,346 dated Feb. 14, 1995 which discloses a frequency conversion technique comprising first and second mixer stages connected in cascade that are supplied from first and second wide tuning range programmable Local Oscillator (LO) synthesizers, respectively, that allow a small tuning step size to be achieved with two phase locked loops each with larger step size. If this conversion technique were used as the basis for a wide range frequency synthesizer, it would allow an improved combination of tuning step size, acquisition time, phase noise levels, and spurious signal performance relative to a single phase locked loop, but at a significant increase in cost due to its higher complexity. There is no up-down conversion and filtering of a comb line with associated cancellation of the frequency drift and phase noise which would otherwise be imparted by an oscillator used to convert the comb line. There is no pretuning feature mentioned nor is there any showing of an arrangement to eliminate spurious frequency signals from the output microwave frequency signal.

U.S. Pat. No. 5,291,428 issued Mar. 1, 1994 discloses an apparatus for reducing spurious frequency components in the output signal of a direct digital synthesizer by generating a dither waveform representing a band limited waveform. The dither waveform is summed with the modulation data words prior to application to the wave function converter to provide a dither modulate analog output signal to spread the spurious frequency components into the noise floor. The added dither waveform is then canceled from the output signal in the analog section of the apparatus. An indirect advantage of the present invention is the partial spreading of spurious signals into the noise floor in a fashion similar to that described in U.S. Pat. No. 5,291,428. Whereas, U.S. Pat. No. 5,291,428 intentionally adds a dither waveform which is cancelled out in the desired signal but not in the spurious signals, in the present invention the relatively high phase noise of the local oscillator has an effect similar to that of the dither waveform.

U.S. Pat. No. 4,105,946 issued Aug. 8, 1978 discloses a frequency synthesizer with a phase locked loop including a voltage controlled oscillator (VCO) which has its frequency controlled by a bias voltage. The VCO is pretuned by measuring the VCO frequency and then stepping the control voltage to the VCO to adjust the VCO frequency. Every time a new frequency is tuned, one or more frequency measurement steps must be taken before phase locking is initiated There is no immediate application of the pretune voltage which is much faster.

U.S. Pat. No. 4,272,729 issued Jun. 9, 1981 teaches the automatic pretuning of a voltage controlled oscillator in a frequency synthesizer by utilization of a successive approximation technique requiring many step/decision cycles and requiring a frequency detector and other components. This patent does not teach the immediate application of a pretuning voltage to a VCO without multiple steps and decisions.

Other prior art patents of general interest in the field which did not disclose the specific features and arrangement of the instant invention include U.S. Pat. Nos. 4,328,554; 4,379,271; and 4,516,170.

Accordingly, it is recognized there is presently an unmet requirement for a simple, low cost, broad range multi-octave frequency synthesizer which is capable of operating in the microwave range. The frequency synthesizer apparatus needs to be compact, capable of being miniaturized, of light weight and easily controlled by a microprocessor over small incremental steps without the requirement of hardware modification. The microwave frequency synthesizer needs to have high performance especially with regard to reduction of phase noise and minimization of spurious frequencies and be capable of high speed tuning performance under a variety of ambient temperatures.

It is therefore an objective of the present invention to provide an new and improved apparatus and method to meet these identified requirements.

SUMMARY OF THE INVENTION

The foregoing requirements are met and other advantages are provided by a new and improved microwave frequency synthesizer for generating frequencies up to a predetermined level such as 20 GHz.

Briefly stated, a preferred embodiment of the invention contemplates oscillator means to generate a determinable frequency signal and means responsive to a frequency signal received from the oscillator means to generate a predetermined Intermediate Frequency (IF) signal. Preferably, the responsive means includes a comb generator means to generate a comb of spaced frequency signals, a mixer means that is responsive to a received comb of frequency signals and to a frequency signal received from the oscillator means to generate a comb of spaced upwardly converted frequency signals, and filter means which receives such comb of upwardly converted frequency signals and passes only one comb frequency signal as the predetermined IF signal. Means are included to generate a determinable ultrahigh frequency (UB) signal which may be changed to provide fine steps in the output frequency signal. The UHF signal generating means uses phase locked loop (PLL) circuitry having a Voltage Controlled Oscillator (VCO) and is subject to pretuning of the VCO so that upon selection of a particular frequency step of the UHF signal the VCO may have a tuning voltage applied to it which instantly tunes the VCO to such step and at the particular ambient temperature being experienced by the apparatus. Included are means responsive to the IF signal and to a UHF signal to generate a resultant frequency signal and means responsive to the resultant frequency and to the predetermined frequency signal generated by the oscillator means to generate the desired predetermined microwave frequency signal.

The invention as described thus far effectively removes frequency drift and phase noise that might be attributable to the oscillator means from the microwave frequency output signal. Further, since the UHF signal is converted directly to the output signal ( without multiplication) any phase noise, spurious, and frequency transients arising from the UHF source means are applied directly to the output signal without any increase, such as would be experienced in a frequency multiplication. Preferably, the invention also includes a means to switch the resultant frequency signal into one of at least two channels, each channel having a predetermined bandwidth that precludes certain spurious frequency signals from appearing in the desired predetermined frequency signal.

The foregoing has outlined rather broadly the more pertinent and important features of the present invention in order that the detailed description of the invention that follows may be better understood so that the present contribution to the art may be more fully appreciated. Additional features of the invention will be described hereinafter which form the subject of the claims of the invention. It should be appreciated by those skilled in the art that the conceptions and the disclosed specific embodiments may be readily utilized as a basis for modifying or designing other structures and methods for carrying out the same purposes of the present invention. It should also be realized by those skilled in the art that such equivalent constructions and methods do not depart from the spirit and scope of the invention as set forth in the appended claims.

BRIEF DESCRIPTION OF THE DRAWINGS

For a fuller understanding of the nature and objects of the invention, reference should be had to the following detailed description taken in conjunction with the accompanying drawings in which:

FIG. 3 is a chart illustrating the various frequencies used in the apparatus of FIG. 1 and represents one example of how the spurious frequency signal termed 2R - L is eliminated from the final microwave frequency output signal.

DETAILED DESCRIPTION OF THE INVENTION

Figure 1:
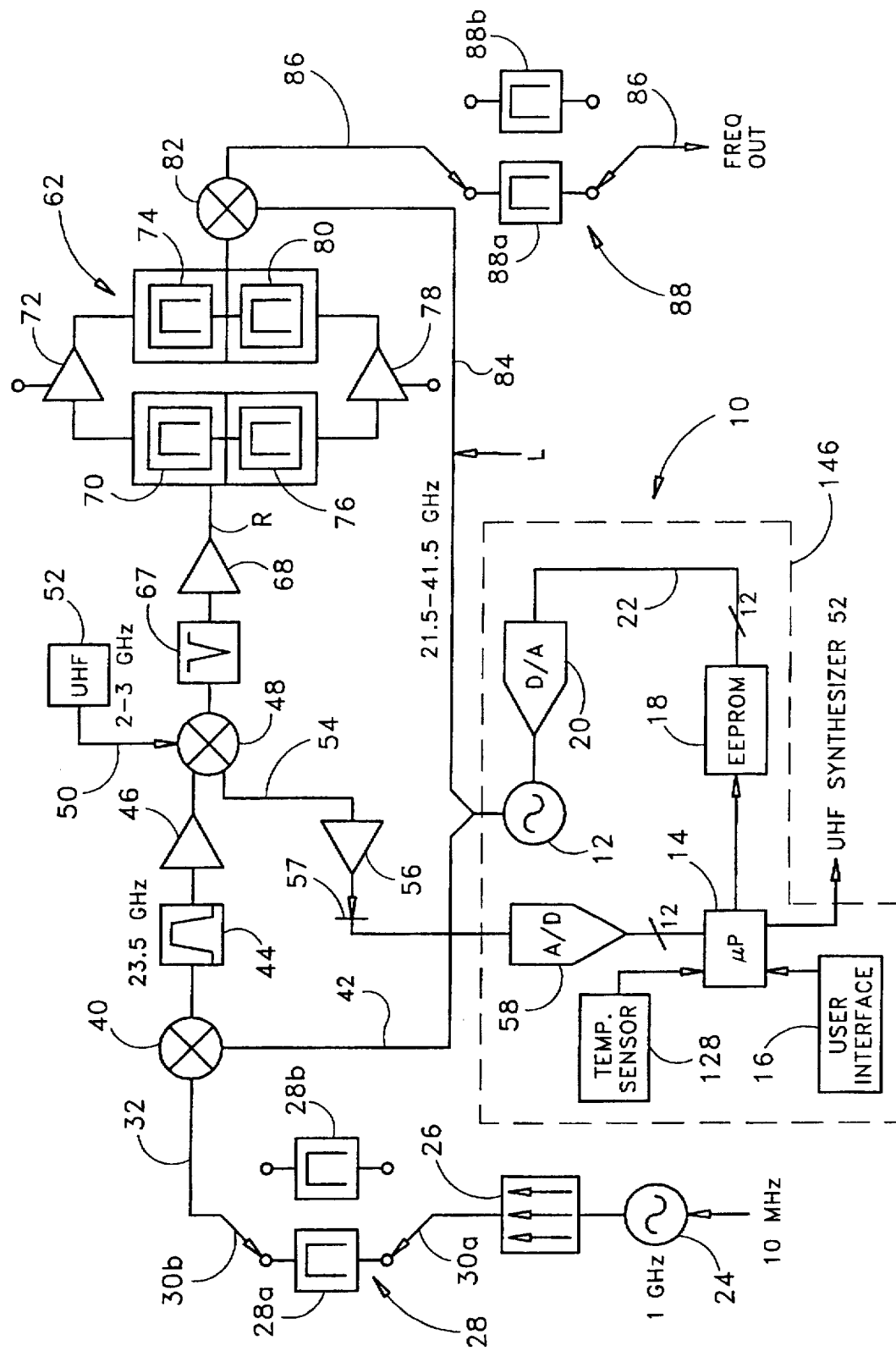
FIG. 1 is a simplified schematic block diagram of a microwave frequency synthesizer arrangement constructed accordance with a preferred embodiment of the present invention.

Referring now to the drawings in detail and in particular to FIG. 1, reference character 10 generally refers to a microwave frequency synthesizer having an output and constructed in accordance with a preferred embodiment of the present invention. The frequency synthesizer 10 includes an oscillator means to generate a determinable frequency signal. This oscillator means includes a suitable oscillator 12 which is capable of generating a frequency signal in a range that may extend generally from 21.5 to 41.5 GHz. The oscillator 12 may be used in a Phase Locked Loop (PLL) circuit having a Voltage Controlled Oscillator (VCO) that is controlled by a control voltage applied thereto as is common in the art, or could be set to a frequency predicted by calibration.

The illustrated up-down conversion scheme, which consists of applying the output of VCO 12 to both mixers 40 and 82 greatly reduces the phase contribution of the VCO 12 to the output signal 86. Phase noise L(f), at the output on VCO 12 will be modified by multiplication with $H(f) = 4 \sin^2[\pi f \tau]$ where f is the frequency offset from the signal, and r is the group delay difference of signals 42 and 84 as measured at the VCO 12 output to the system 10 output 86. This very important feature allows a low performance and low cost oscillator 12 to be used as in the implementation of the invention as opposed to a bank of fixed tuned oscillators or other means of signal generation of the signals 84 and 42.

A suitable microprocessor 14 receives a command on its input 16 acting as a system interface to tune the output microwave frequency signal of the microwave frequency synthesizer 10 to a specific frequency. Such command on input 16 could be manual, a software command or other suitable source of command. The microprocessor 14 is coupled to a suitable memory means, such as a EEPROM 18, which generates a 12 bit control word representative of the particular frequency signal to be generated by the oscillator 12 for use in the synthesizer arrangement 10 to generate the desired microwave frequency output signal. The 12 bit control word is coupled from the EEPROM 18 to a suitable digital to analog (D/A) signal converter 20 via line 22. The output voltage control signal of the D/A converter 20 is applied to the VCO of the oscillator 12 to pretune such VCO to the precise frequency output signal required to be generated by the oscillator 12 for generation of the desired output signal by the synthesizer arrangement 10. The calibration of oscillator means to generate immediately a desired precise frequency signal at an ambient temperature of the synthesizer 10 will be described in detail hereinafter.

A means responsive to a frequency signal received from the oscillator means to generate a predetermined Intermediate Frequency (IF) signal is provided. This responsive means includes a suitable oscillator 24 which may be in the form of a stabilized Standing Acoustic Wave (SAW) oscillator which receives a 10 Mhz. reference input and generates a 1 GHz. output that is applied to a suitable comb generator circuit 26. The comb generator 26 generates a comb of spaced frequency signals over a bandwidth to 1–18 GHz. The comb line of frequencies are preferably spaced at 1 GHz. intervals.

The comb generator 26 is coupled to a bifurcated filter arrangement 28a and 28b by a suitable switch means 30a and 30b. The filter arrangement 28a and 28b is adapted to pass one band of comb frequency signals, for example, a band of comb frequency signals 3–9 GHz. though filter 28a and a second band of comb frequency signals 10–18 GHz. through filter 28b. The switch means 30a and 30b select the filter channel through which a band of comb signals will be directed in accordance with control signals received from the microprocessor 14. The filters 28a and 28b are used to reduce the total input power applied to mixer 40 as required if the chosen mixer 40 cannot operate satisfactorily with the entire bandwidth of combs from comb generator 26. The selected filter, 28a or 28b, is chosen based on the required comb line as needed for the selected output frequency.

The output of the selected filter channel 28a or 28b is coupled through line 32 to a suitable mixer 40 which also receives on line 42 a determinable frequency signal from the oscillator 12. The frequency signal from the oscillator 12 is determined on the basis that the particular comb frequency signal that has been passed through a filter channel 28a or 28a will yield a frequency signal at 23.5 GHz. The band of comb frequency signals that is input to the mixer 40 is added to the determinable frequency signal input to the mixer 40 by the oscillator 12. The mixer 40 is coupled to a suitable narrow band pass filter 44 which has as its center 23.5 GHz. Thus, of the particular band of comb frequency signals summed by the mixer 40 only one frequency signal, namely the 23.5 Ghz. signal, is permitted to pass and is termed the Intermediate Frequency (IF) signal of the synthesizer 10. By centering the IF signal, the 23.5 GHz. signal, in the filter 44 the passage of spurious undesired frequency signals is minimized.

The IF signal of 23.5 GHz. is then suitably amplified by amplifier 46 and input to a suitable mixer 48 for mixing with an input signal on input 50 which is received from the UHF source 52. The UHF source 52 provides a signal that ranges from 2–3 GHz. and is generally generated with increments of about 1 MHz. The UHF source 52 is shown in more detail in FIG. 2 and will be described later.

A line 54 is coupled to the chain at the input for the mixer 48 to provide a signal representative of the filter 44 output to the microprocessor 14 or use in generation of a precise frequency signal by the oscillator 12. The signal that appears on line 54 is amplified by a suitable amplifier 56, detected by detector 57, and converted by a suitable analog to digital (A/D) converter 58 to a 12 bit word that is coupled to the microprocessor 14.

It will be recognized at this point that the major set points of the eventual output frequency signal are provided by the comb frequency signals and the output signal is shifted by the fine tune signal provided by the UHF source to provide coverage of desired frequencies between the comb signals.

The resultant frequency signal appearing on the output of mixer 48, after passing through a suitable filter 67 to remove the 23.5 IF signal, as is required to minimize spurious signals, is suitably amplified by the amplifier 68, and is applied to a signal channel arrangement 62. The signal channel arrangement 62 includes a first channel for passing resultant frequencies in a band of 25.5–26.5 GHz. and a second channel for passing resultant frequencies in a band of frequencies in a band of 20.5–21.5 GHz.

The particular implementation of the signal channel arrangement 62 includes in the first channel a filter 70, a switched gate 72, and another filter 74. The second channel includes a filter 76, a switched gate 78, and a second filter 80. Thus, the combination of a switched gate and filters in each of the two channels insures that only 25.5–26.5 GHz. signals will be passed by the first channel and only 20.5–21.5 GHz. signals will be passed by the second channel. The switching of the gates 72 and 78 is determined by the required output frequency and selection of an upper/lower sideband from mixer 48 which provides optimum spurious signal performance.

The frequency signal passed by the signal channel arrangement is then input to a suitable mixer 82. The same oscillator frequency signal generated by the oscillator 12 is then input on line 84 to the mixer 82. The mixer 82 subtracts the frequency of the signal passed by the signal channel arrangement 62 from the oscillator frequency signal appearing on input 84 to produce the desired output frequency signal on output 86. The desired output frequency signal appearing on output 86 is then passed through a suitable filter 88 to limit the output frequency signal range to the desired band of output signals and also to further eliminate any undesired spurious frequency signal. The filter 88 is preferably a switched filter arrangement which has a first filter 88a which passes a band of 12–20 GHz. while the second switched filter 88b passes output frequency signals in a range of 0–12 GHz. The switching of the filter arrangement is accomplished in the same manner as is the switching of the signal channel arrangement 62. The desired output frequency signal may then be amplified as desired by a suitable amplifier for use elsewhere as desired.

The inclusion of the signal channel arrangement 62 is for a specific purpose, namely to minimize spurious frequency signals from appearing in the desired output signal appearing on output 86 of the mixer 82. As was seen, the output of the mixer was the result of the subtraction of the resultant frequency signal from the oscillator frequency signal. If the oscillator signal is termed L and the resultant frequency signal were to be termed R, then the desired output frequency signal is represented by the term L-R. However, it has been found that certain spurious frequency signals, for example, the term 2R-L, can occur in the final mixer 82 and crossover with the desired output signal L-R. Such crossover can occur when R=2/3L. For example, if the desired output frequency signal were to be 12.5 GHz. then R would be 25 GHz. and L would be 37.5 GHz. then R would equal 2/3L and a crossover spurious frequency at the desired output frequency would be generated.

The present invention includes a novel feature to avoid the spurious frequency signal from appearing in the output frequency signal. The mixer 48 adds or subtracts the UHF frequency signal from the IF signal according to which signal channel the resultant frequency signal output of the mixer 48 is to be directed in order to separate the spurious frequency signal from the desired output frequency signal. By shifting the resultant frequency signal into an upper sideband by the addition of the UHF signal or by shifting the resultant frequency signal into a lower sideband by the subtraction of the UHF signal and directing the resultant signal through the first or second signal channels the desired output frequency signal is separated from the spurious frequency signal.

Thus, for example, if the desired output frequency signal is in a range of less than 12 GHz. then the spurious frequency signal will appear at a level of greater than 13.5 GHz. Similarly, if the desired range of the output frequency signal is above 12.0 GHz. then the spurious frequency signal will appear lower than a frequency of 9.5 GHz. Thus, the final output frequency signal appearing on output 86 may be finally separated by the switched filter arrangement 88 in the event that any of the spurious frequency signal has nonetheless appeared in the output of the mixer 82.

Figure 3:
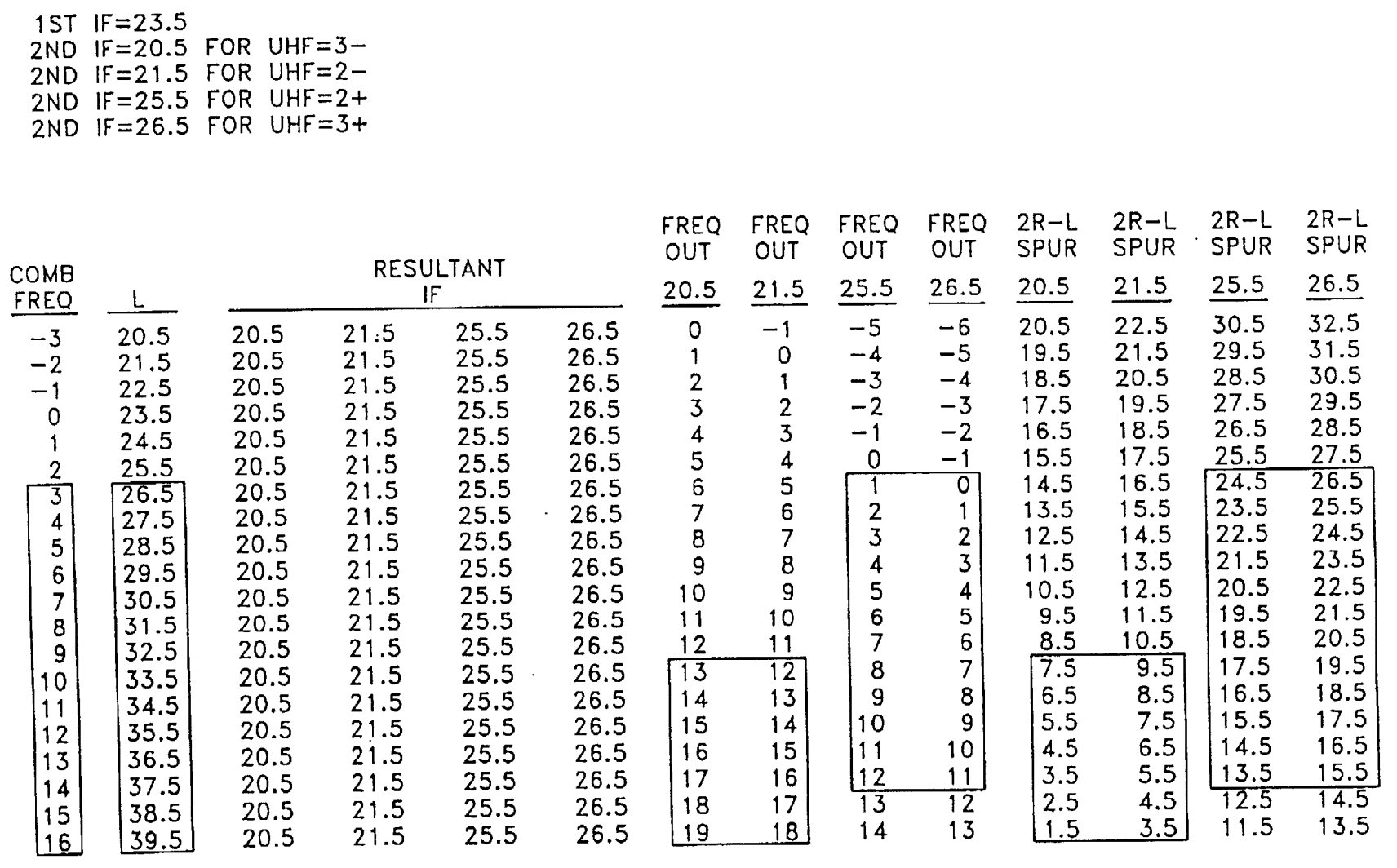

Referring now to FIG. 3, a chart is shown which shows various frequencies which are generated by the synthesizer 10 and how the synthesizer 10 avoids the unwanted spurious frequency signal 2R-L appearing as a crossover signal in the synthesized output frequency signal. The tables illustrate the particular comb frequency signals generated by the comb generator 26 and the frequency signals generated by the local oscillator 12 to yield the fixed IF signal of 23.5 GHz. The resultant IF signal generated by the mixer 48 is shown for the various UHF signals provided by the UHF source 52 are also shown. The tables also illustrates the exemplary output frequency signals that are generated over a band of 0–20 GHz. with the first band being from 0–12 GHz. and the second band being from 12–20 GHz. The tables also show the undesired spurious frequency signal 2R-L that may be generated for the various values of R and L and how such spurious frequencies fall into bands that are precluded from appearing in the output frequency by the arrangement of the novel synthesizer 10.

Figure 2:
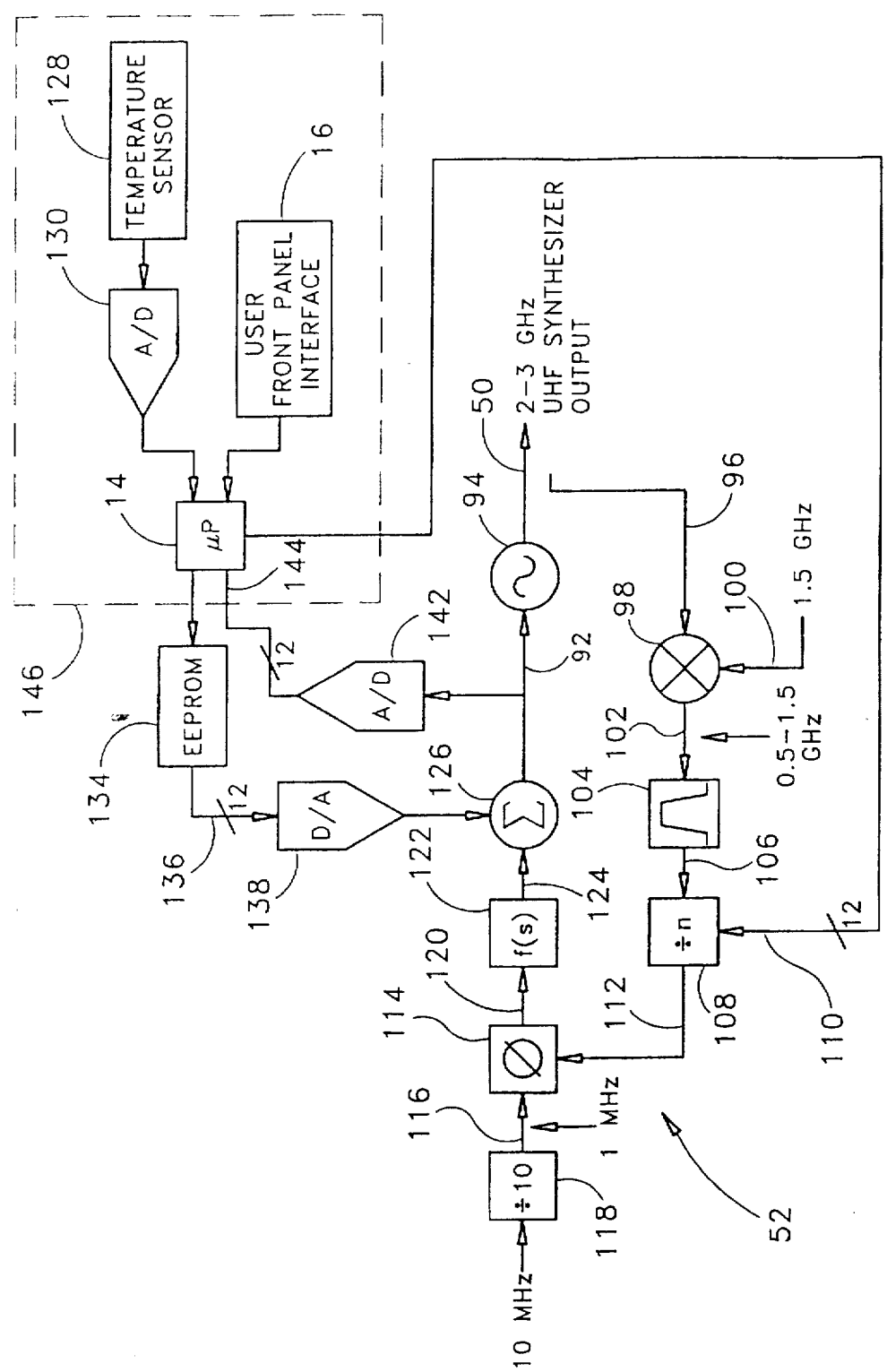
FIG. 2 is a simplified schematic block diagram of the UHF signal source section that is used with the arrangement of FIG. 1.

Referring now to FIG. 2, the UHF source 52 will be described in greater detail. The UHF source 52 includes a voltage controlled oscillator (VCO) 94 having an output 50 which is controlled by the voltage appearing on input 92 of the VCO 94. The UHF source 52 includes single phase locked loop (PLL) circuitry in which a lead 96 is coupled to the output 50 to provide a signal identical to that being generated by the oscillator 94. The signal on lead 96 is input to a suitable mixer 98 which also receives a 1.5 GHz. signal on input 100. The 1.5 GHz. signal on input 100 is subtracted by the mixer 98 from the signal on lead 96 to provide an output signal on lead 102 of 0.5 to 1.5 GHz. The signal on lead 102 is coupled through a suitable bandpass filter 104 to appear on the input 106 of a divider 108 which divides the signal appearing on lead 106 by an integer N that is provided on input 110 from the microprocessor or microcontroller 14.

The output of the divider 108 appears on lead 112 as an input to a suitable phase detector 114. The phase detector 114 also receives a reference input on lead 116 from divider 118. The divider 118 divided a stable reference signal of 10 Mhz. by 10 to provide a stable reference input of 1 Mhz. on input 116. The phase detector output 120 is passed through a suitable loop filter/amplifier 122 to appear as a fine control voltage on input 124 to summer 126.

The UHF source 52 also has a feature that greatly reduces the settling time of such source after a change in the output frequency signal has been commanded and also adjusts the control voltage of the VCO for the ambient temperature experienced by the synthesizer 10. This feature is implemented by a suitable temperature sensor 128 having an analog output that is converted by a suitable analog to digital converter 130 which is then input to the microprocessor 14 on input 132. A user front panel interface 16 or other input is also connected to the microprocessor 14 to enable a desired output frequency signal to be selected. The microprocessor 14 is coupled to a suitable memory means in the form of an EEPROM 134 which provides a control word on an output 136 which is coupled to a suitable digital to analog converter 138 which converts the digital signal to an analog signal that appears on lead 140 connected as an input to the summer 126. The output of the summer 126 appearing on the input 92 to the oscillator 94 is coupled to a suitable analog to digital converter 142 which converts such signal to a 12 bit word that is input on lead 144 to the microprocessor 14. The dotted outline 146 encloses certain components which are common to the microwave portion of the synthesizer 10 shown in FIG. 1.

The operation of the UHF source 52 to provide accurate fine tuning voltages for the VCO that compensate for ambient temperatures will now be described in greater detail. In operation, the EEPROM 134 stores the digital words used to accurately pretune the VCO 94 via the converter 138 and the summer 126 before phase locking is initiated. When a user commands a particular frequency via inputs from the front panel interface 16 or a software command, the microprocessor 14 translates this output frequency request into an EEPROM address. The requested output frequency does not determine the enter EEPROM address, however. The last several bits of the EEPROM address are determined by the operating temperature of the synthesizer 10. The temperature sensor 128 outputs an analog voltage signal proportional to the temperature. This analog output signal is then fed into the A/D converter 130. The digital output on lead 132 from the converter 130 is read by the microprocessor 14 which then sets the lowest bits of the EEPROM address based on this input information that is representative of the ambient temperature then being experienced by the synthesizer 10. Setting the lowest 4 bits of the EEPROM address using this method, for example, would divide the overall operating temperature range into $2^4$ or 16 subranges each with a somewhat different pre-tune voltage supplied to the VCO 94 for the same desired synthesizer output frequency. This temperature feature is used primarily to compensate for inherent VCO 94 frequency variation with temperature. The number of temperature subranges and therefore the number of EEPROM address bits set as a function of temperature are determined by the VCO 94 frequency variation with temperature and the desired pretune accuracy.

With respect to the feature of greatly increasing the pretune accuracy and settling speed of the synthesizer 10, the fine tuning characteristics of the 2–3 GHz. VCO 94 used in the UHF source 52 are known from the measured data of a number of such VCO's 94. For each desired output frequency of the UHF source 52, the microprocessor sets the D/A converter 138 to provide approximately the correct VCO 94 output frequency based on the known approximate tuning curve of the VCO 94. During this step the output of the loop filter/amplifier 122 appearing on lead 124 as an input to the summer 126 is set to 0 volts. The variable ratio frequency divider 108 is set to provide the desired output frequency after phase lock. The PLL is then locked (the output voltage from the loop filter/amplifier 122 appearing on lead 124 as an input to the summer 126 is released from 0 volts). In the preferred embodiment, the precise VCO 94 tuning voltage corresponding to the UHF source 52 output frequency then appears at the A/D converter 142. In an alternate embodiment, the loop is unlocked (with the output of the loop filter/amplifier 122 again being set to 0 volts) and the D/A converter 138 is stepped until the A/D converter 142 has the same reading as it had in the locked state. The byte value into the D/A converter 138 at the end of this sequence is stored at the appropriate EEPROM 134 address corresponding to that frequency and temperature.

For many applications the stepping of the D/A converter 138 will not be required, since the D/A converter 138 and the A/D converter 142 analog voltages versus digital words are known accurately enough to simply calculate the required D/A converter 138 input word based on the AID converter 142 reading after phase locking. This sequence may be repeated at all desired UHF source 52 output frequencies and over temperature at suitable temperature step increments, however linear interpolation between temperatures and frequencies may be applied so that the microprocessor may calculate EEPROM values so that the calibration procedure may be reduced. After calibration, the EEPROM 134 provides a highly accurate pretuned voltage to the VCO 94 for all frequencies and temperatures so that the phased locked loop tunes very quickly.

Referring again to FIG. 1, the calibration of the microwave portion of the synthesizer 10 will be described. The microprocessor 14 steps the D/A converter 20 through its entire range via the EEPROM 18. This tunes the VCO 12 monotonically through its range from its low end frequency to its high end frequency. This in turn mixes comb lines from the comb generator 26 though the passband of filter 44 in ascending order of comb frequency. A coupler 54/ amplifier 56/detector 57 in combination with the A/D converter 58 continuously monitors the power at the output of the filter 44 as each comb is swept through this filter. For each D/A 20 step, the A/D converter 58 converts the analog voltage from the detector 57 and it is recorded. In addition, the frequency at the output of the synthesizer 10 (the output of filter 88) is measured and recorded using a frequency counter which is part of the calibration setup. Because the UHF source 52 input is set to a fixed frequency, which for present purposes may be considered to be 2 GHz, during this process, the frequency of the comb line mixed into the pass band of filter 44 can be calculated from the measurement at the output of filter 88. In such instance, the output frequency of filter 88 will be the particular comb frequency signal plus 2 GHz.

Once the D/A converter 20 sweep of oscillator 12 is completed, the optimum D/A converter 20 settings providing the best VCO 12 tuning voltages can be calculated and stored in the EEPROM 18. For any commanded synthesizer output frequency, a known comb frequency must be selected and centered in the filter 44 passband. It will be recalled that each comb frequency signal is actually used for a 1 GHz. range of output frequencies as the UHF synthesizer 52 is varied from 2-3 GHz. From the frequency data taken in the calibration sequence it can be determined which comb line frequency was in the filter 44 passband for each D/A 20 setting, and from the amplitude data it can be determined which D/A converter 20 setting optimally centered that comb line signal in the passband filter 44. From the above information, the EEPROM 18 is programmed for optimal comb line centering at each output frequency at that particular temperature. This process may be repeated over a range of temperatures. The EEPROM 18 has addresses for multiple temperature ranges for each output frequency signal as was the instance for the UHF source 52 as described above. The above described calibration sequence for the microwave source portion of the synthesizer 10 is general in nature and it is within the scope of the present invention to modify such calibration sequence in many ways and to shorten it as desired.

In field usage of the synthesizer 10 contemplates periodic initiation of self calibration by such synthesizer. This self calibration typically is initiated after the synthesizer has been placed in a standby mode. When placed in the standby mode, the synthesizer 10 determines the existing ambient temperature range from the temperature sensor 128. It then checks whether a minimum amount of time has elapsed since the last calibration at this temperature by referencing a system clock as may be included in the microprocessor 14 and previous calibration time stamps as recorded in the microprocessor, for example. If the minimum time has elapsed from such last calibration, a recalibration sequence is performed. If the synthesizer 10 is taken off standby and placed in operation during the self calibration sequence, the synthesizer 10 will record its place in the sequence and continue where it left off when again place on standby.

The UHF source 52 self calibration would typically consist of stepping through and locking every tuned frequency. At each tuned frequency, the A/D converter 142 representing the tune voltage is recorded, the PLL loop for the VCO 94 is opened, and the D/A converter 138 is stepped until the A/D converter 142 provides the same reading as it did when the PLL for the VCO 94 was locked. For many applications, the stepping of the D/A converter 138 will not be required, since the D/A converter 138 and A/D converter 142 analog voltages versus the digital words are known accurately enough to simply calculate the required D/A input based on the A/D converter 142 reading. The new D/A input word is stored in the EEPROM 18 for each desired output frequency at that ambient temperature.

The microwave source portion of the synthesizer 10 would consist of resweeping each comb line frequency through the filter 44 band as noted above and storing the new D/A converter word that optimally centers each comb frequency of the filter 44. Since the VCO 12 drift over time is small, the same comb frequency will be in the passband of filter 44 for any particular D/A converter 20 setting as existed at the end of the original calibration. Because of this, measurement of the output frequency at filter 88 to determine which comb line frequency is in the passband filter 44 is not required. In an alternate embodiment of the invention, the VCO 12 could be phase-locked, and hence a calibration procedure similar to that described for the UHF portion could be applied if desired to minimize tuning time.

In summary, it has been illustrated that the present invention provides a novel arrangement and method for synthesizing frequencies in the microwave region with high tuning speed and a minimization of phase noise and spurious frequency signals. The invention also is adapted to provide a desired frequency quickly in accordance with whatever ambient temperature the synthesizer is then experiencing. The disclosed microwave frequency synthesizer is compact, light weight and capable of being miniaturized.

The present disclosure includes that contained in the appended claims as well as that of the foregoing description. Although this invention has been described in its preferred forms with a certain degree of particularity, it is understood that the present disclosure of the preferred form has been made only by way of example and numerous changes in the details of construction and combination and arrangement of parts and method steps may be resorted to without departing from the spirit and scope of the invention.

What is claimed is:

1. A microwave frequency synthesizer arrangement for generating quickly a desired predetermined output frequency signal that has reduced spurious frequency signals and which comprises:

oscillator means to generate a determinable frequency signal;

means responsive to said determinable frequency signal received from the oscillator means to generate a predetermined Intermediate Frequency (IF) signal;

means to generate a determinable ultrahigh frequency (UHF) signal within a predetermined bandwidth;

means responsive to the IF signal and to the UHF signal to generate a resultant output frequency signal;

means responsive to the resultant frequency signal and to the determinable frequency signal generated by the oscillator means to generate the desired predetermined frequency signal; and means to switch the resultant frequency signal into one of at least two channels, each channel having a predetermined bandwidth that precludes a spurious frequency signal appearing in the desired predetermined output frequency signal.

2. The arrangement of claim 1 wherein the means responsive to the IF signal and to an UHF signal either adds or subtracts the UHF signal from the IF signal, and the switching means is responsive to the addition of the UHF signal to the IF signal to pass that resultant addition frequency signal to a first channel and is responsive to the subtraction of UHF signal from the IF signal to pass that resultant subtraction frequency signal to a second channel.

3. The arrangement of claim 2 wherein each channel of the switching means includes filtering means and gate means for passing only an addition resultant frequency signal or a subtraction resultant frequency signal.

4. The arrangement of claim 3 wherein the UHF frequency signal generating means includes a phase locked loop voltage controlled oscillator (VCO) means to generate such UHF frequency signal, and memory means to store tuning signals representative of control voltages for the VCO whereby a tuning signal may be selected from the memory means for application to the VCO for generation by the VCO of a desired precise UHF frequency signal.

5. The arrangement of claim 4 wherein the memory means of the UHF frequency signal generating means further stores adjustment tuning signals that are representative of control voltages for the VCO when the oscillator experiences specific ambient temperatures whereby when the oscillator experiences a specific ambient temperature an adjustment signal may be accessed from the memory means and provide a control voltage to the VCO for generation of a specific UHF frequency signal at the ambient temperature then being experienced by the local oscillator.

6. The arrangement of claim 5 wherein the means to generate a predetermined IF signal includes:

a comb generator means to generate a comb of spaced frequency signals;

mixer means that is responsive to a comb of spaced frequency signals and to a frequency signal received from the oscillator means to generate a comb of spaced frequency signals, and filter means which receives such comb of frequency signals and passes only one predetermined IF signal.

7. An apparatus for generating a desired predetermined output frequency that has reduced spurious frequency signals and which is free from any frequency drift and phase noise generated by an oscillator means included in such apparatus, which apparatus comprises:

means to generate a comb, having a desired bandwidth, of predetermined frequency signals, each comb frequency signal being separated by a predetermined bandwidth from an adjacent frequency signal;

oscillator means to generate a determinable frequency signal;

means responsive to the comb frequency signals received from the comb generator means and to a frequency signal received from the oscillator means to generate a specific predetermined Intermediate Frequency (IF) signal;

means to generate a determinable ultrahigh frequency (UHF) signal within a predetermined band width;

means responsive to the IF signal and to said UHF signal to generate a resultant frequency signal, and means responsive to the determinable resultant frequency signal and to the frequency signal generated by the oscillator means to generate the desired predetermined output frequency signal; and means to switch the resultant frequency signal into one of at least two channels, each channel having a predetermined bandwidth that precludes a spurious frequency signal appearing in the desired predetermined output frequency signal.

8. The apparatus of claim 7 wherein the means for generating a comb of desired predetermined frequency signal with a desired frequency band includes filter means to separate a predetermined band of combs having a predetermined relationship to the band of desired output frequency signals.

9. The apparatus of claim 8 wherein the responsive means to generate an IF frequency signal includes filter means to select a determined fixed IF frequency signal.

10. The apparatus of claim 9 wherein the UHF signal generating means includes a phase locked loop (PLL) circuitry including a voltage controlled oscillator (VCO) that is responsive to a coarse tune command to generate a predetermined control voltage for the VCO.

11. The apparatus of claim 10 wherein the UHF signal generating means further includes memory means for storing signals representative of a control voltage for the VCO to generate a precise UHF signal whereby the memory means is responsive to a command to the apparatus to generate a precise frequency signal for applying a fine tune control voltage to the VCO.

12. The apparatus of claim 11 wherein the memory means for storing voltage control signals includes signals representative of control voltages for the VCO when the apparatus is subjected to a range of ambient temperatures whereby a signal may be accessed for application to the VCO when the apparatus is experiencing a particular temperature for generation by the VCO of a specific frequency signal for that temperature.

13. A method for generating quickly a desired predetermined frequency signal that is free from spurious frequency signals which comprises the following steps:

generating a determinable oscillator frequency signal;

using said determinable frequency signal to generate a fixed intermediate frequency (IF) signal;

generating a determinable ultrahigh frequency (UHF) signal within a predetermined bandwidth;

mixing the IF signal and said UHF signal to generate a resultant frequency signal;

directing the resultant frequency signal into one of a plurality of signal channels, such channel for a resultant signal being chosen to avoid spurious frequency signals for the desired precise output frequency signal, and mixing the resultant frequency signal and the determinable oscillator frequency signal to generate a predetermined precise output frequency signal.

14. The method of claim 13 wherein the step of generating an IF signal includes the steps of using a comb generator to generate a comb of spaced frequency signals, and mixing the determined oscillator frequency with the comb of spaced frequency signals and filtering from such mixed comb frequency signals the desired IF signal.

15. The method of claim 14 wherein the step of generating the UHF signal includes selecting a stored tuning voltage representative of a specific UHF signal and applying such tuning voltage to a voltage controlled oscillator in phase locked loop circuitry to generate the desired UHF signal.

16. The method of claim 15 wherein the selecting step further includes selecting a tuning voltage for a specific ambient temperature.

17. The method of claim 16 wherein the mixing step includes adding or subtracting the UHF signal to or from the IF signal to generate the resultant frequency signal.

18. The method of claim 17 wherein the directing step includes directing the resultant frequency signal into at least a first channel when the UHF signal has been subtracted from the IF signal and directing the resultant frequency signal into at least a second channel when the UHF signal has been added to the IF signal whereby a spurious frequency signal is blocked from the chosen signal channel.

19. The method of claim 18 which includes the further step of subjecting the output of the mixing of the resultant frequency signal and the oscillator frequency signal to filtering means to pass only the predetermined precise output frequency signal to reject unwanted spurious signals.

20. A method for generating with a predetermined high tuning speed a desired predetermined frequency output signal having a desired spectral purity which comprises the following steps:

generating a determinable oscillator frequency signal that may be subject to frequency drift and phase noise;

using said determinable predetermined frequency signal to generate a fixed intermediate frequency (IF) signal;

generating a determinable ultrahigh frequency (UHF) signal within a predetermined bandwidth;

mixing the IF signal and said UHF signal to generate a resultant frequency signal;

directing the resultant frequency signal into one of a plurality of signal channels, such channel for a resultant signal being chosen to avoid spurious frequency signals for the desired precise output frequency signal, and mixing the resultant frequency signal and the determinable oscillator frequency signal to generate a predetermined precise output frequency signal that is free from any frequency drift and phase noise attributable to the oscillator means.

21. The method of claim 20 wherein the step of generating the UHF signal includes selecting a stored tuning voltage representative of a specific UHF signal and applying such tuning voltage to a voltage controlled oscillator in phase locked loop circuitry to generate the desired UHF signal, which UHF signal may be subject to limited undesired components such as phase noise, spurious transients and frequency transients but which undesired components will not be multiplied in the output signal.

22. The method of claim 21 wherein the mixing step includes adding or subtracting the UHF signal to or from the IF signal to generate the resultant frequency signal whereby the UHF signal is converted directly into the resultant frequency signal and any limited phase noise, frequency or spurious transients carried by the UHF signal are applied directly to the resultant frequency signal without increase.

23. A microwave frequency synthesizer arrangement for generating quickly a desired predetermined output frequency signal that has reduced spurious frequency signals and which comprises:

a single oscillator to generate a determinable frequency signal;

means responsive to said determinable frequency signal received from the oscillator means to generate a predetermined Intermediate Frequency (IF) signal;

means to generate a determinable ultrahigh frequency (UHF) signal within a predetermined bandwidth;

means responsive to the IF signal and to the UHF signal to generate a resultant output frequency signal; and means responsive to the resultant frequency signal and to the determinable frequency signal generated by the oscillator means to generate the desired predetermined frequency signal.

24. An apparatus for generating a desired predetermined output frequency that has reduced spurious frequency signals and which is free from any frequency drift and phase noise generated by an oscillator included in such apparatus, which apparatus comprises:

means to generate a comb, having a desired bandwidth, of predetermined frequency signals, each comb frequency signal being separated by a predetermined bandwidth from an adjacent frequency signal;

an oscillator to generate a determinable frequency signal;

means responsive to the comb frequency signals received from the comb generator means and to a frequency signal received from the oscillator means to generate a specific predetermined Intermediate Frequency (IF) signal;

means to generate a determinable ultrahigh frequency (UHF) signal within a predetermined band width;

means responsive to the IF signal and to said UHF signal to generate a resultant frequency signal; and means responsive to the determinable resultant frequency signal and to the frequency signal generated by the oscillator means to generate the desired predetermined output frequency signal.

* * * * *